United States Patent [19]

Nakayama

[11] Patent Number: 5,422,841
[45] Date of Patent: Jun. 6, 1995

[54] SEMICONDUCTOR MEMORY DEVICE HAVING REVERSE BASE CURRENT BIPOLAR TRANSISTOR-FIELD EFFECT TRANSISTOR MEMORY CELL

[75] Inventor: Osamu Nakayama, Kawaguchi, Japan

[73] Assignee: Texas Instruments Incorporated, Dallas, Tex.

[21] Appl. No.: 170,434

[22] Filed: Dec. 20, 1993

Related U.S. Application Data

[63] Continuation of Ser. No. 622,249, Dec. 4, 1990, abandoned.

[30] Foreign Application Priority Data

Dec. 28, 1989 [JP] Japan .................................. 1-339764

[51] Int. Cl.⁶ ...................... G11C 11/34; H01L 29/72
[52] U.S. Cl. .................................. 365/174; 365/177; 365/178; 365/225.6; 257/591; 257/592
[58] Field of Search .................. 365/177, 178, 225.6, 365/226, 174; 257/555, 556, 591, 592

[56] References Cited

U.S. PATENT DOCUMENTS

| | | |
|---|---|---|
| 4,089,022 | 5/1978 | Asai et al. ............................ 257/574 |
| 4,217,688 | 8/1980 | Ipri ....................................... 257/574 |
| 4,258,379 | 3/1981 | Watanabe et al. ................... 257/574 |
| 4,260,430 | 4/1981 | Itoh et al. ............................. 257/574 |
| 4,550,491 | 11/1985 | Depey ................................... 257/574 |
| 4,599,635 | 7/1986 | Itoh et al. ............................. 257/574 |
| 5,038,191 | 8/1991 | Hasegawa et al. ................... 365/177 |
| 5,060,194 | 10/1991 | Sakui et al. .......................... 365/177 |

OTHER PUBLICATIONS

Sakui, K. et al. *A New Static Memory Cell Based on Reverse Base Current (RBC) Effect of Bipolar Transistor;* International Electrical Devices Meeting Dec. 1988 pp. 44–47.

Primary Examiner—Jack B. Harvey
Assistant Examiner—Jack A. Lane
Attorney, Agent, or Firm—William E. Hiller; Richard L. Donaldson

[57] ABSTRACT

A semiconductor memory device, which has a memory cell comprising the following transistors: a transistor for selecting; and a bipolar transistor for memorizing, which has a base region whose base concentration as either lower than an ordinary base concentration or higher than an ordinary base concentration and which is constructed so as to generate a reverse base current.

13 Claims, 10 Drawing Sheets

PRIOR ART

SEMICONDUCTOR MEMORY DEVICE HAVING REVERSE BASE CURRENT BIPOLAR TRANSISTOR-FIELD EFFECT TRANSISTOR MEMORY CELL

This application is a continuation of application Ser. No. 07/622,249, filed Dec. 4, 1990, now abandoned.

BACKGROUND OF THE INVENTION

1. Field of the Invention

This invention relates to a semiconductor memory device, for example, a semiconductor memory device which is suited for static RAM (random access memory).

2. Description of the Prior Art

Recently, a new memory cell for static RAM comprising one bipolar transistor and one MOS transistor has been announced by Toshiba Corporation at 1988 IEDM (International Electrical Devices Meeting) (for further details, refer to Sakui, K., Hasegawa, T., Fuse, T., Watanabe, S., Ohuchi, K. and Masuoka, F.: "A new static memory cell based on reverse base current (RBC) effect of bipolar transistor", 1988 International Electrical Devices Meeting, Technical Digest, thesis No. 3.2, pp. 44–47, December 1988, or pp. 283–285 of the Nikkei Electronics, 1989. 2. 20 (No. 467)). Aiming at large capacity memory with over 16M bit, this memory cell has a memory principle which is entirely different from that of the conventional static RAM or dynamic RAM in that the two transistors constituting the memory cell, a P-channel MIOS transistor and an NPN transistor, respectively, are used as a transistor for selecting and a transistor for memorizing. And the output of said memory cell shows a high level when the base-emitter voltage of said NPN transistor is about 0.9 V, and a low level when said voltage is 0 V (that is, the NPN transistor takes bistable states), and these two states, respectively, are equivalent to "1" or "0".

The operating principle of said memory cell and its problems will be described hereunder with reference to FIGS. 12 and 13.

Figure 12:
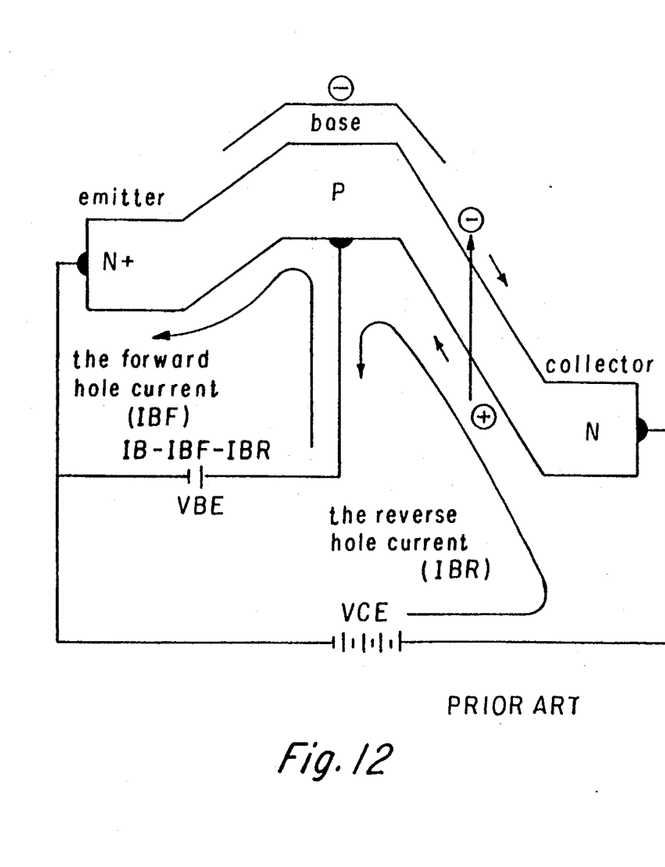
FIG. 12 is an energy band diagram of a bipolar transistor for memorizing in the conventional memory cell.

The operating principle of this memory cell is to utilize a physical phenomenon, called impact ionization, of the NPN transistor: as shown in FIG. 12, when a collector-emitter voltage $V_{CE}$ of about 6 V is applied to the NPN transistor which has an emitter-collector dielectric breakdown voltage of about 13 V, electron-hole pairs by impact ionization are generated at a base-collector PN junction region by electrons injected from the emitter at this time. Out of the electron-hole pairs, the electrons move to the collector, and the holes to the base, and an ordinary forward hole current $I_{BF}$, which flows from a base to the emitter, is restricted by a base-emitter voltage $V_{BE}$, so that the holes generated by impact ionization flow as a reverse hole current (hereinafter may be called simply reverse base current) $I_{BR}$ in a direction reverse to the ordinary hole current $I_{BF}$.

Furthermore, the base current $I_B$ when impact ionization is going on may be expressed as follows:

$$I_B = I_{BF} - I_{BR}$$
$$= I_{BF} - (M - 1) I_c$$

wherein $I_C$ is a collector current, and M is an impact ionization coefficient. M is expressed by the following formula:

$$M = 1/[1 - (V_{BC}/BV_{CBO})^n]$$

wherein $V_{BC}$ is a voltage applied between the base, and the collector, and $BV_{CBO}$ is an insulation breakdown voltage of the base-collector PN junction. In this case the test results and the actual calculations are considered to agree when n is assumed as 4.6.

Figure 13:
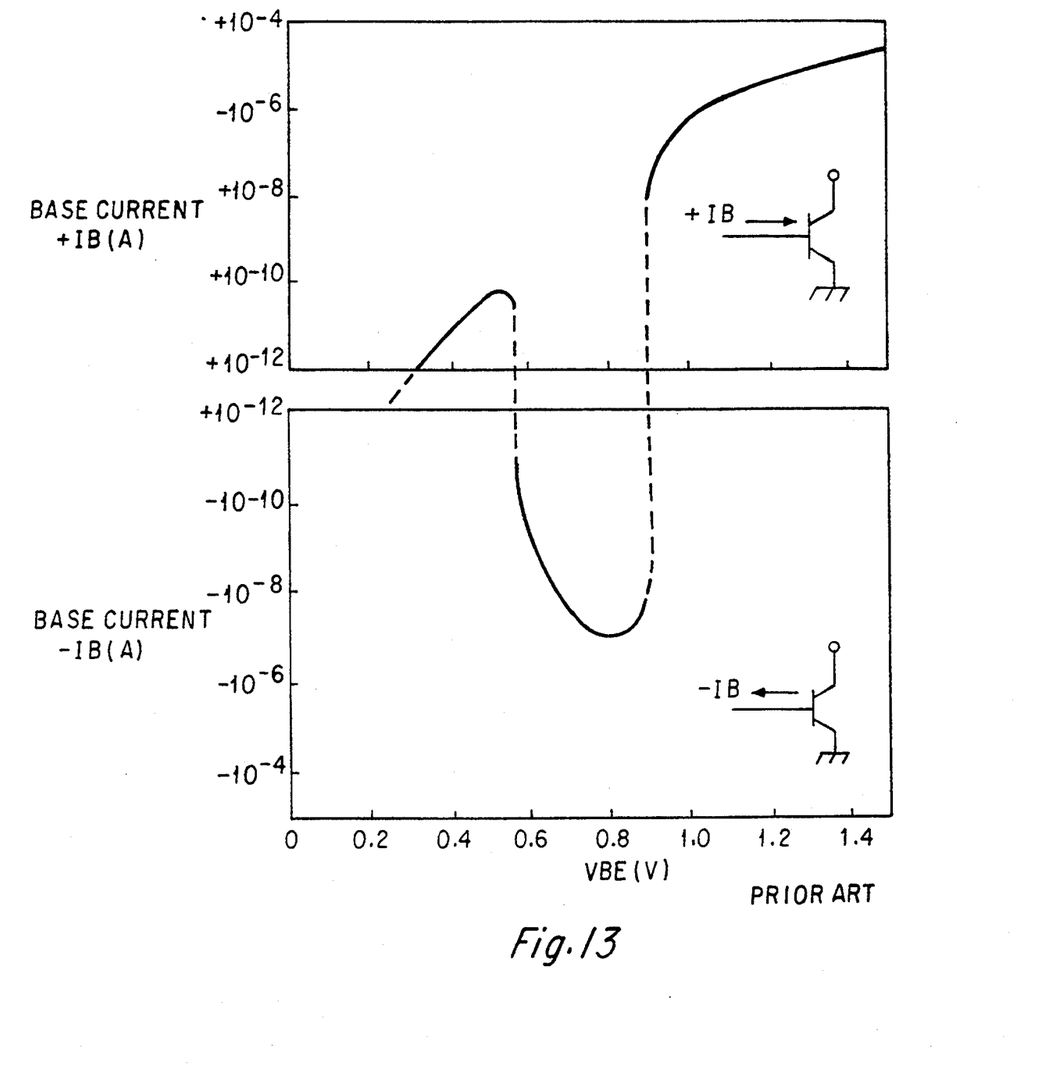
FIG. 13 is a graph showing the $V_{BE}$-$I_B$ characteristic of the bipolar transistor for memorizing in the conventional memory cell.

In a cell actually produced for trial, as shown in FIG. 13, when $0.57\ V < V_{BE} < 0.90\ V$, the reverse hole current $I_{BR}$ becomes greater than the forward hole current $I_{BF}$, and when the base-emitter voltage $V_{BE}$ is set at around 0.9 V, both the reverse and forward currents become equal, leading the base current $I_B$ to stop apparently. Even though the P-channel MOS transistor for selecting is closed in such a state, $V_{BE}$ remains at about 0.9 V, and this state is "1". In addition, when $V_{BE}$ is set at 0 V, the base current $I_B$ does not flow, presenting a state of "0".

In practice, when the P-channel MOS transistor is closed with $V_{BE}$ set at 0.5 V or higher, the hole current stops, leading to $V_{BE}$ of about 0.9 V, so that it is not necessary to set it at 0.9 V from the outset. Furthermore, when $V_{BE}$ is smaller than 0.5 V, it likewise becomes 0 V.

As described above, the operating principle of the foregoing memory cell lies in impact ionization in the NPN transistor, wherein a memory operation is performed by finding a logical state of memory in the base-emitter voltage $V_{BE}$ when the base current $I_B$ becomes 0 through utilization of the positive-negative inversion of said base current $I_B$ caused by the outflow of holes (the reverse hole current $I_{BR}$) from a base electrode, said holes being those of the electron-hole pairs generated by impact ionization at the collector-base PN-junction region.

Said base current $I_B$, as shown in FIG. 13, changes in the order of "+", "−" and "+" accompanied by the change of the base-emitter voltage $V_{BE}$, and the range of the base-emitter voltage during the flow of negative current is $0.57\ V < V_{BE} < 0.90\ V$. However, when the device is used within the above-mentioned voltage range in an ordinary bipolar transistor, though depending upon the shape of transistor, a relatively large collector current $I_C$ inevitably flows. This causes a very big problem in producing a large capacity static RAM as described above.

Actually in the memory cell announced by Toshiba Corp. it has been confirmed that said memory cell induces the flow of a collector current such as 500 uA per bipolar transistor for memorizing. Hence this leads to a very high consumption of power in consideration of a large capacity static RAM in practice.

Figure 14:
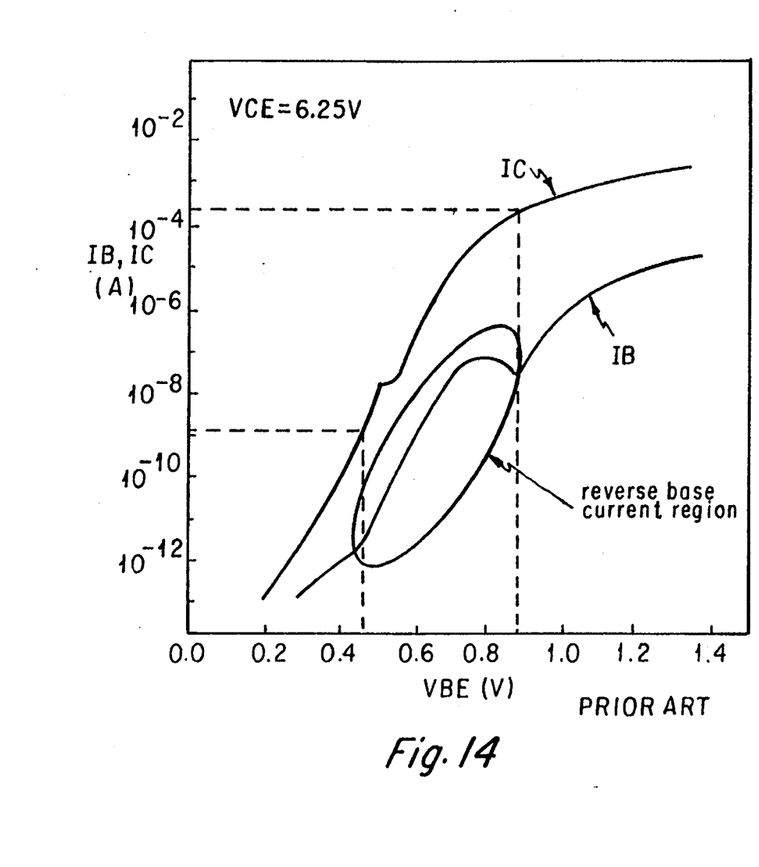
FIG. 14 is a graph showing the $V_{BE}$-$I_B$ and $I_C$ characteristic of the bipolar transistor for memorizing by Gummel plot in the conventional memory cell.

Incidentally, FIG. 14 shows the $V_{BE}$-$I_B$ and $I_C$ characteristic of said NPN transistor based on the so-called Gummel plot when the collector-emitter voltage $V_{CE}$ is set at 6.25 V.

OBJECT AND SUMMARY OF THE INVENTION

The object of this invention is to provide a semiconductor memory device which may reduce the consumption of electric current for a bipolar transistor for memorizing, and thus produce a low power dissipation and large capacity static RAM or the like.

In other words, this invention provides a semiconductor memory device having a memory cell which includes the following transistors: a transistor for selecting; and a bipolar transistor for memorizing, which has a base region whose base concentration is either lower than an ordinary base concentration or higher than an ordinary base concentration, and which is constructed so as to generate a reverse base current.

BRIEF DESCRIPTION OF THE DRAWINGS

FIGS. 1 to 11 show the embodiments of this invention, wherein:

FIGS. 12 to 14 show an example of the prior art, wherein:

DETAILED DESCRIPTION OF THE PREFERRED EMBODIMENTS

The embodiments of this invention will be described hereunder.

First, the structure of a device in accordance with an embodiment in which this invention is applied to a static RAM will be described with reference to FIGS. 1 and 2.

Figure 1:
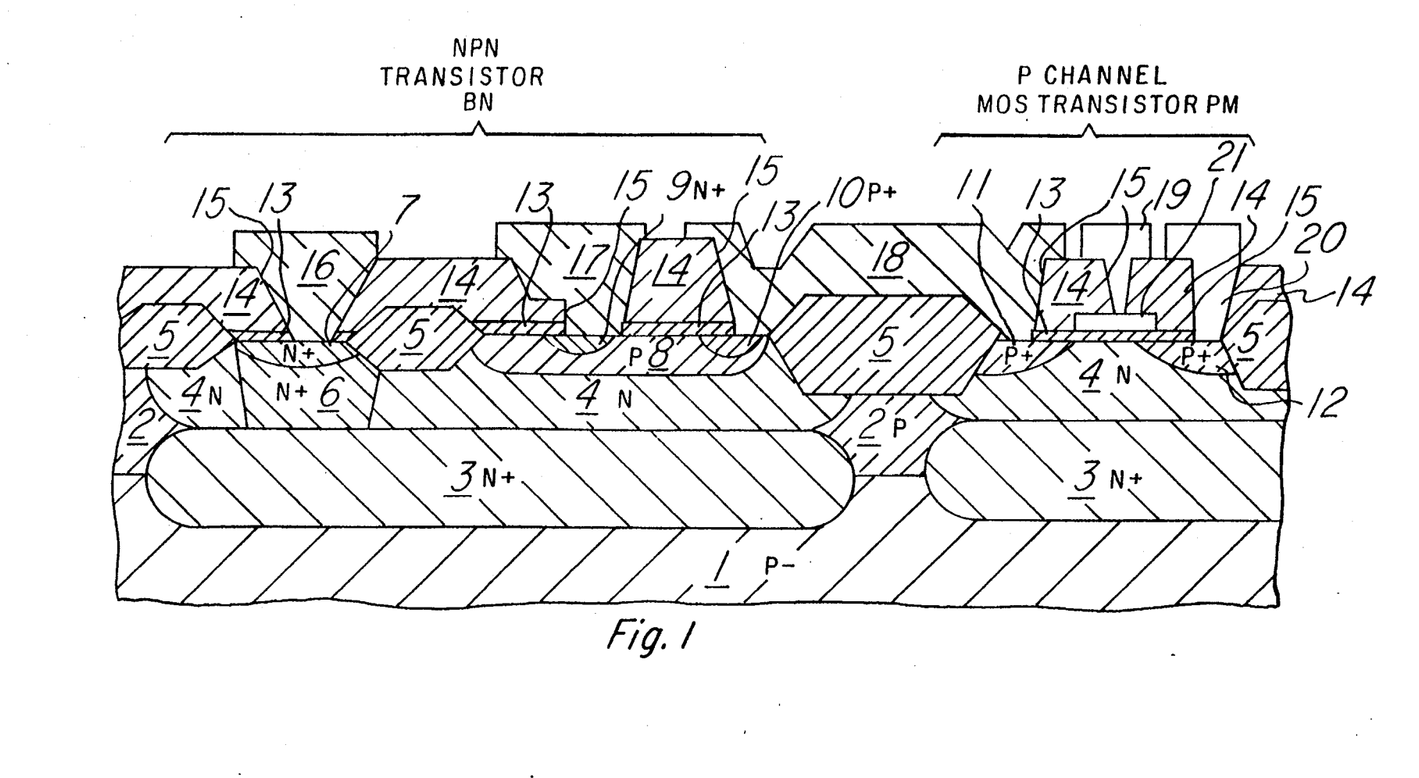
FIG. 1 is a cross-sectional view of a memory cell showing an example in which this invention is applied to a static RAM (a cross-sectional view taken along the lines I—I in FIG. 2 below)
Figure 2:
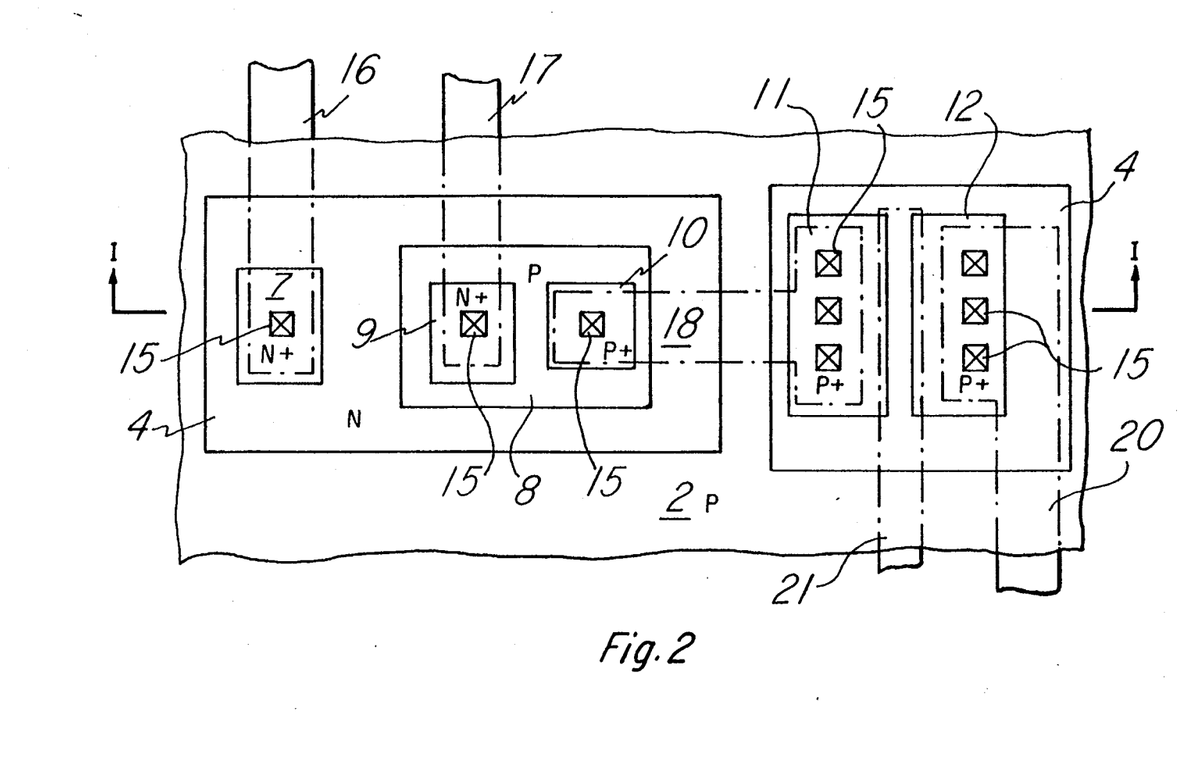
FIG. 2 is a plane view of FIG. 1.

With a P-type epitaxial layer 2 provided on one main surface of a P⁻-type silicon substrate 1 via an N⁺-type buried layer 3, as shown in FIG. 1, a P-type base region 8 and an N⁺-type diffusion region 6, respectively, are formed by a diffusion technique in an N-type diffusion region (N-well) formed on the N⁺-type buried region 3. And in the P⁺-type base region 8 an N⁺-type collector region 9 and a P⁻-type base electrode take-out region 10, respectively, are formed by the diffusion technique, and in the N⁺-type diffusion region 6 an N⁺-type emitter electrode take-out region 7 is formed by the diffusion technique. Hence in this NPN-type vertical bipolar transistor (transistor for memorizing) BN the emitter electrode take-out region 7 and a base region 8 are connected via the N-type diffusion region 4, the N⁺-type buried layer 3 and the N⁺-type diffusion region 6.

On the other hand a P⁺-type drain region 11 and a P⁺-type source region 12 are formed in a predetermined pattern in the N-type diffusion region 4 provided on the N⁺-type buried layer 3, and a P-channel MOS transistor (transistor for selecting) PM is constructed with a gate electrode 21 provided between said regions via a gate oxide film 13.

Figure 3:
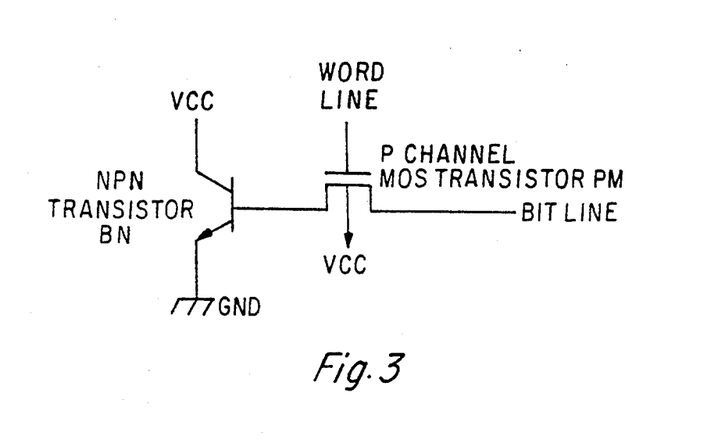
FIG. 3 is an equivalent circuitry diagram of the memory cell in FIG. 1.

As shown in FIG. 1, the base contact region 10 of the NPN transistor BN and the drain region 11 of the P-channel MOS transistor PM are connected by a distribution layer 18 formed via contact holes 15, leading to the construction of a memory cell as shown in the equivalent circuitry diagram in FIG. 3. In the diagram, in addition, the numeral 5 is field oxide film, 14 is an insulating layer, 16 is an emitter electrode, 17 is a collector electrode, 19 is a word line, 20 is a bit line, and FIG. 2 is a plane view of FIG. 1 (FIG. 1 is a cross-sectional view taken along the line I—I in FIG. 2).

Figure 4:
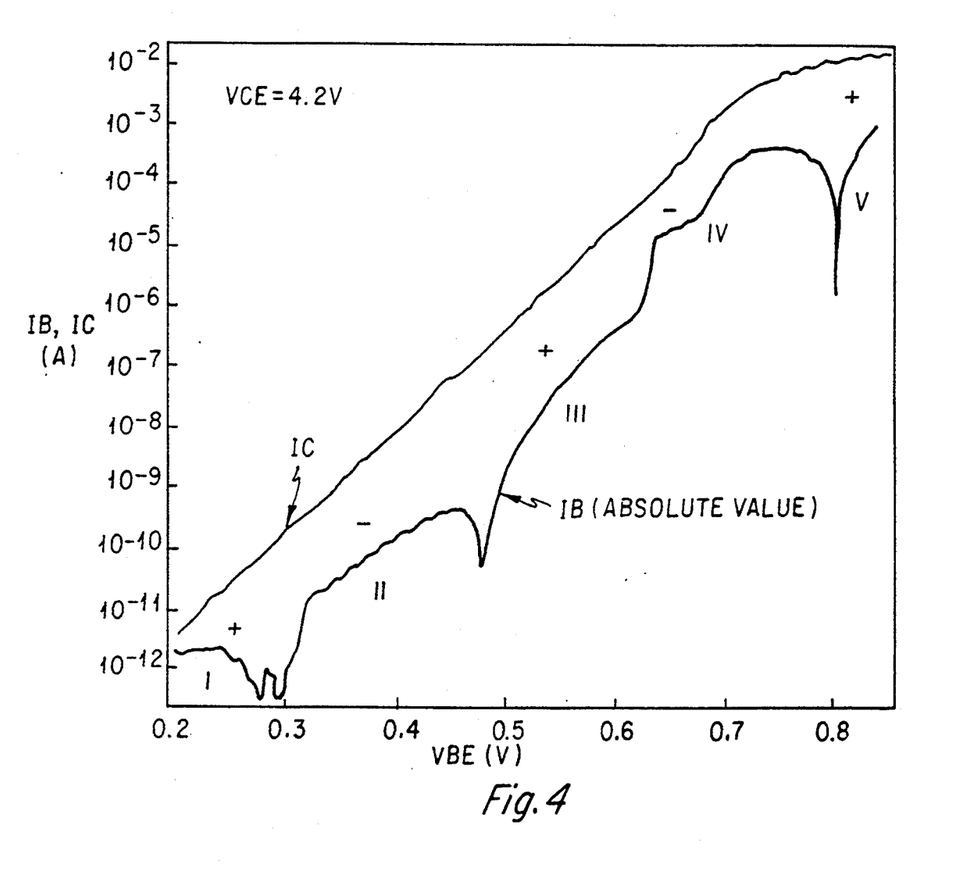
FIG. 4 is a graph showing the $V_{BE}$-$I_B$ and $I_C$ characteristic of the bipolar transistor for memorizing by Gummel plot in the memory cell in FIG. 1.

Here, what is important in this embodiment is that a base-emitter voltage $V_{BE}$ causing impact ionization by optimizing the impurity concentration profile of each region in the NPN transistor BN is set at lower than a PN-junction built-in potential (charged voltage) of 0.6 V, thus enabling the "+" and "−" inversion of the above described base current $I_B$. That is, in this example, as described above, the construction is made so that the range of the base-emitter voltage $V_{BE}$ allowing the flow of the reverse base current $I_{BR}$ is set not at 0.57 to 0.9 V, but at an extremely low voltage range of 0.3 to 0.48 V to generate the reverse base current $I_{BR}$ and thereby reduce the consumption of current (collector current $I_C$) for the NPN transistor BN as shown in FIG. 4 and that the above-mentioned memory operation is performed under the condition that the base-emitter voltage $V_{BE}$ is set at a voltage range of 0.2 to 0.5 V.

With regard to the impurity concentration of each region of an ordinary NPN transistor, the emitter (an arsenic or phosphorus concentration, for example) has a high concentration of $10^{20}$cm⁻³, the collector (a phosphorus concentration, for example) has $10^{15}$ cm⁻³, and the base (a boron concentration, for example) has $10^{18}$cm⁻³, so that unless a high collector-emitter voltage $V_{CE}$ of 6 V is used, as described above, there is no reverse base current $I_{BR}$ generated by impact ionization. In addition, to generate a reverse base current $I_{BR}$ within the range of a low base-emitter voltage $V_{BE}$ as in this example, it is thought that a relatively high collector-emitter voltage $V_{CE}$ must be given in the NPN transistor in the above-mentioned concentration relationship.

Thus, in this example the relationship of impurity concentration in each region is set in the NPN transistor BN with the above-mentioned structure, as follows: the base region concentration (boron concentration, for example) is preferably $10^{17}$cm⁻³ order or less as its upper limit and preferably $10^{14}$cm⁻³ order or more as its lower limit, and more preferably $2 \times 10^{16}$cm⁻³ order or less as the upper limit and more preferably $10^{15}$ cm⁻³ order or more as the lower limit; the collector region concentration (arsenic concentration, for example) is preferably $10^{18}$cm⁻³ or more and $10^{22}$cm⁻³ or less, more preferably $10^{19}$cm$^{-3}$ or more and $5 \times 10^{21}$cm$^{-3}$ or less, and the emitter region concentration (phosphorus concentration, for example) is preferably $2 \times 10^{13}$cm$^{-3}$ or more and $10^{17}$cm$^{-3}$ or less, more preferably $10^{14}$cm$^{-3}$ or more and $10^{16}$cm$^{-3}$ or less.

The above-mentioned device may be readily produced by, for example, an ordinary bi-MOS technique (a combination of bipolar technique and MOS technique), and an impurity to concentration in each region may also be readily set by controlling ion implantation or other conditions at the time of manufacture.

The $V_{BE}$-$I_B$ characteristic in the NPN transistor BN in the above-mentioned impurity concentration relationship is, as shown in FIG. 4, that as the base-emitter voltage $V_{BE}$ is raised from 0 V, the base current $I_B$ changes in the order of "+" (region I in the diagram), "−" (region II in the diagram), "+" (region III in the diagram), "−" (region IV in the diagram), and "+" (region V in the diagram), thus resulting in two-time inversion to a "−" base current $I_B$ (in this example, however, the collector region concentration is set at $1.23 \times 10^{20}$cm$^{-3}$, the base region concentration at $3.0 \times 10^{15}$cm$^{-3}$ and the emitter region concentration at $1.3 \times 10$cm$^{-1}$). In addition, the $V_{BE}$-$I_B$ and $I_C$ characteristic as shown in FIG. 4 is illustrated by the so-called Gummel plot and both the base current ("+" base current) flowing into the base and the base current ("−" base current) flowing out of the base are shown on the same graph.

Figure 5:
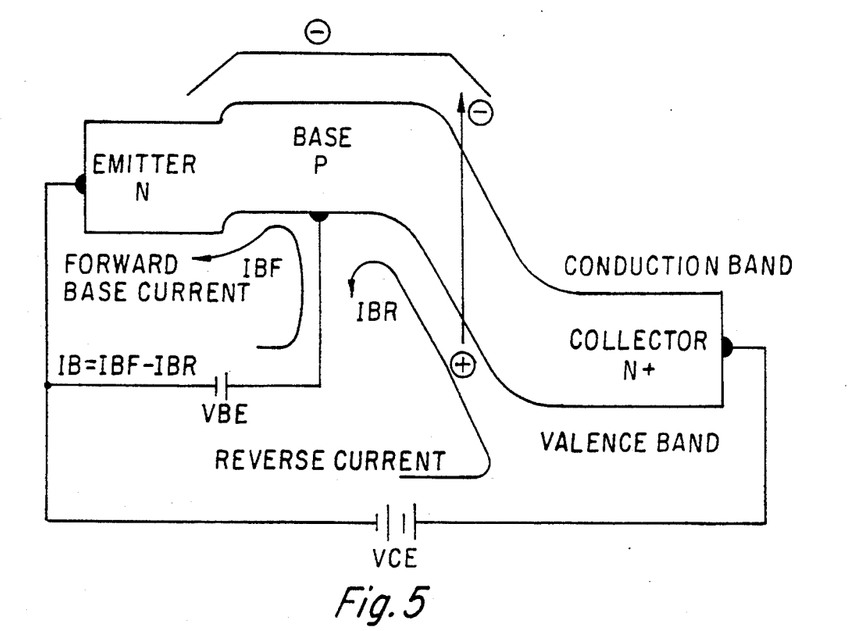
FIG. 5 is an energy band diagram of the bipolar transistor for memorizing in the memory cell in FIG. 1.

Next, the $V_{BE}$-$I_B$ and $I_C$ characteristic as shown in FIG. 4 will be described hereunder together with the energy band diagram in FIG. 5 and the $h_{FE}$ characteristic in FIG. 6.

Figure 6:
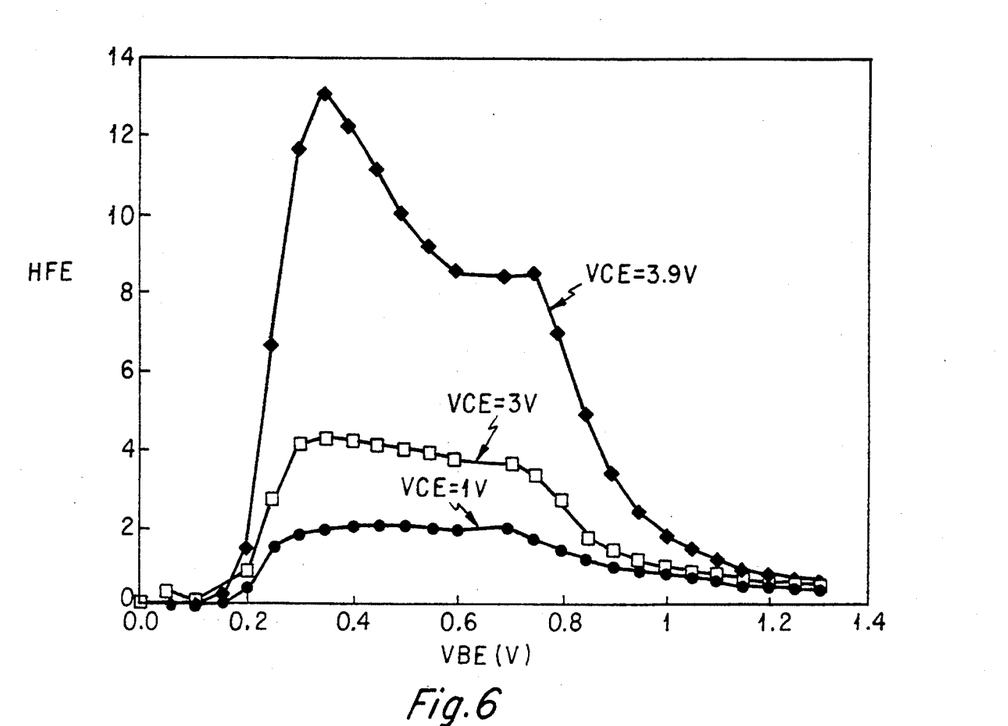
FIG. 6 is a graph showing the $V_{BE}$-$h_{FE}$ characteristic of the bipolar transistor for memorizing in the memory cell in FIG. 1.

However, FIG. 6 shows a current amplification factor $h_{FE}$ when the collector-emitter voltage $V_{CE}$ is varied to be 1 V, 3 V or 3.9 V, indicating the point immediately before impact ionization becomes marked (that is, when almost no reverse base current $I_{BR}$ flows as yet). Here, an important point in FIG. 6 is described. That is, what is important in FIG. 6 is that the base-emitter voltage $V_{BE}$ when the current amplification factor $h_{FE}$ rises up is found to be about 0.2 V as shown in the diagram. Moreover, when $V_{BE}$ becomes 0.3 V, especially when a high collector-emitter voltage $V_{CE}$ is applied, there is a rapid increase in the current amplification factor $h_{FE}$, and when said $V_{BE}$ is 0.3 V, the inversion of the base current $I_B$ has started as shown in FIG. 4. In other words, the cause of the initial base current conversion, which constitutes the most important characteristic of this invention in a low current region, is found in the rapid rise of the current amplification $h_{FE}$ in the neighborhood of 0.3 V.

Hereunder is a description of the mechanism for the inversion of the base current $I_B$ in each of the regions I to V in FIG. 4.

[Region I: $V_{BE}$=0 to 0.3 (V)]

A region in which a micro base current $I_B$ in the "+" direction flows in the same manner as in an ordinary bipolar transistor. Many of the components of the base current $I_B$ are those obtained by recombination.

[Region II: $V_{BE}$=0.3 to 0.48 (V)]

Within this voltage range the collector current $I_C$ is small as shown in the diagram, and as shown in FIG. 6, the current amplification factor $$h_{FE}\left(=\frac{I_C}{I_B}\right)$$

rises up from the level where $V_{BE}$ is about 0.2 V. In other words, the collector current $I_C$ starts to increase in line with the elevation of $V_{BE}$, thus allowing electrons to be injected from the emitter region as a ground (earth) potential into the base region and then diffused in the base region. In addition, in the boundary region of the base and collector regions, the collector region, as described above, has a concentration of $1.23 \times 10^{20}$cm$^{-3}$, higher than that of the base region, and also has a steep junction, thus reducing the extension of a depletion layer, so that the electric field in said boundary region becomes higher. Hence among the above-mentioned electrons diffused in the base region, those accelerated by the electric field in said boundary region collide against a crystal lattice in the collector region and then beat out the electron-hole pairs. At this time, those electrons of the electron-hole pairs beaten out are absorbed by the collector region, whereas holes are diffused from the base region and observed (see FIG. 5) as a "−" base current $I_B$ (that is, a reverse base current $I_{BR}$). In this example, furthermore, the respective impurity concentrations in the emitter and collector regions of the NPN transistor BN for memorizing are set at a high level of $1.28 \times 10^{20}$cm$^{-3}$ in the collector region and at a low level of $1.3 \times 10^{15}$cm$^{-3}$ in the emitter region (that is to say, the NPN transistor BN is used by reversing the relationship between the collector and emitter impurity concentrations in an ordinary NPN transistor). Hence this leads to a low efficiency of carrier injection from the emitter and a marked increase in hole injection from the base region (that is, the forward base current $I_{BF}$ becomes larger), leading to an increase in the base current $I_B$ to that extent. However, this increase in the base current $I_B$ results in no increase in the collector current to reduce $h_{FE}$ (see FIG. 6), so that the base current $I_B$ stops its increase in the "−" direction when $V_{BE}$ reaches about 0.48 V, and thus exhibits the peak of the base current $I_B$ in the "−" direction, then rapidly increasing in the "+" direction.

[Region III: $V_{BE}$=0.48 to 0.625 (V)]

As shown in FIG. 6, while $h_{FE}$ decreases, a great volume of carriers is injected into the base region, in which the base current $I_B$ increases in the "+" direction with the elevation of the base-emitter voltage $V_{BE}$ in the same manner as in an ordinary bipolar transistor. And the base current $I_B$ peaks at a certain point and then again decreases, thus growing substantially in the "−" direction. This is because electrons accelerated in the depletion layer between the base and the emitter further increase and collide against the crystal lattice in the emitter region due to the great volume of carriers injected from the base region, thus causing holes to suppress the holes injected from the base region and again flow out.

[Region IV: $V_{BE}$=0.625 to 0.8 (V)]

In this region, since the base-emitter voltage $V_{BE}$ exceeds a built-in voltage, the collector current $I_C$ is extremely large as shown in FIG. 4, resulting in the highest impact ionization, so that a large reverse base current $I_{BR}$ is generated. It is this region that is used in the example shown in FIGS. 12 and 13 and it is very difficult, as described above, to put it into practical use as a memory cell because the collector current $I_C$ as great as about 500 μA flows.

[Region V: $V_{BE}$=0.8 (V) or more]

In this region the carriers (electrons) flowing into the base region due to a high base-emitter voltage $V_{BE}$ finally suppresses and erases the holes produced by impact ionization, thus making the collector current $I_C$ extremely large.

Figure 7A:
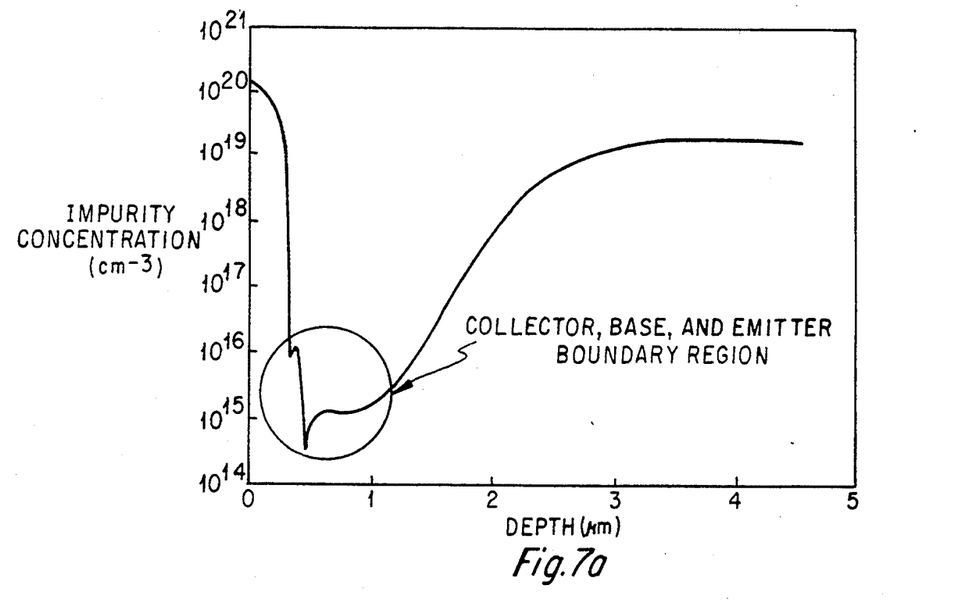
FIG. 7A is a diagram showing one example of an impurity concentration profile for the bipolar transistor for memorizing in the memory cell in FIG. 1.
Figure 7B:
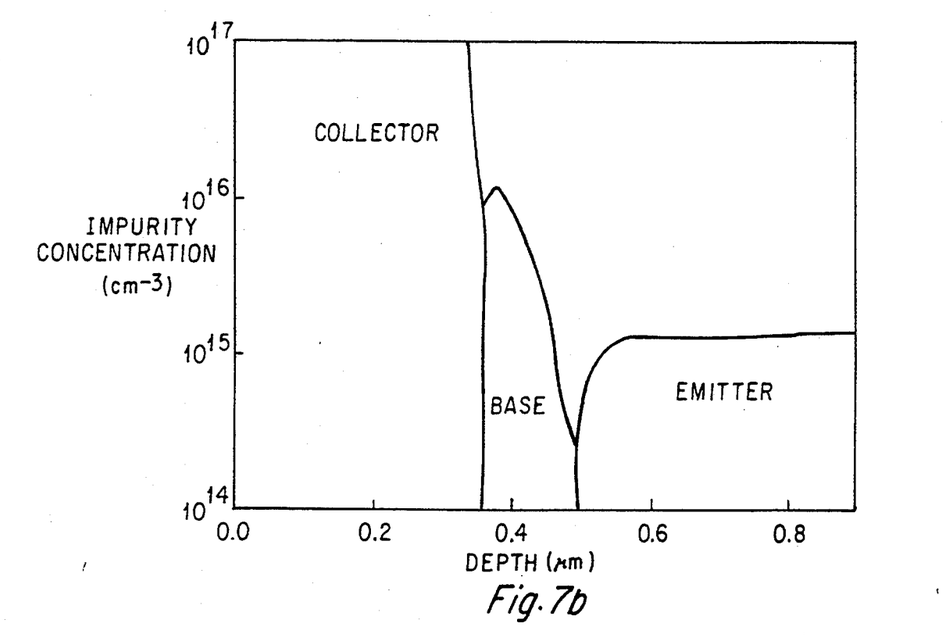
FIG. 7B is an enlarged diagram showing an impurity concentration profile for the collector, base and emitter boundary regions in FIG. 7A.

In addition, FIGS. 7A and 7B show one example of impurity concentration profile in each region in accordance with this embodiment, and FIG. 7B is an enlarged illustration of the collector, base and emitter boundary region shown within a circle in FIG. 7A.

The operation of a memory cell in accordance with this embodiment will be described in the following paragraph. Used as memory in the operation of said memory cell is the base-emitter voltage region $V_{BE}$=0.8 to 0.48 (V) (region II in FIG. 4) up until the base current $I_B$ first appearing in the above-mentioned FIG. 4 changes to the "—" direction and further reaches a peak in the "—" direction to be again $I_B$=0.

In other words, when a voltage ($V_{BE}$) of about 0.3 V is as shown in FIG. 3, applied to the base electrode of the NPN transistor BN for memorizing through the bit line by turning on the P-channel MOS transistor PM for selecting, the base current $I_B$ becomes zero as described above, which represents "0" in a logical state. Even when the P-channel MOS transistor PM for selecting is turned off in such a state, said logical state is maintained (that is, the base-emitter voltage $V_{BE}$=0.3 (V) is maintained: writing of data "0"). Furthermore, when a voltage ($V_{BE}$) of about 0.48 V is applied to the base electrode of the NPN transistor BN for memorizing through the bit line in the same manner as described above, the base current $I_B$ likewise becomes 0, and the base-emitter voltage $V_{BE}$ at this time becomes "1" in the logical state. In this case this logical state is maintained in the same manner as described above (that is, the base-emitter voltage $V_{BE}$=0.48 (V) is maintained: writing of data "1"). Hence the reading of memory is performed by reading out the above-mentioned two respective $V_{BE}$ data through the bit line with the P-channel MOS transistor PM for selecting.

In accordance with this embodiment, as described above, the bipolar transistor BN for memorizing has a base region whose base concentration is lower than the ordinary base concentration and is constructed so as to generate a reverse base current $I_{BR}$, thus enabling the inversion of the base current $I_B$ within a low voltage range of the base-emitter voltage $V_{BE}$ from 0.3 to 0.48 V (that is, facilitating the occurrence of impact ionization in a region at a low level of said $V_{BE}$ by using a low base concentration as well as by means of the collector region having a steep junction and thus allowing the inversion of the initial base current $I_B$ to be readily generated) and arrival at a bistable state. Therefore, this enables the substantial reduction of the collector current $I_C$ as well as the construction of a low power consumption memory cell. In this embodiment, furthermore, the impurity concentration for the collector region is increased as compared with that for the emitter region and the first decline of $h_{FE}$ was brought by lowering the efficiency of carrier injection from the emitter region, thus enabling the inversion of the above-mentioned base current $I_B$ more effectively. As described above, moreover, by increasing the impurity concentration for the collector region and producing a steep junction, the extension of the depletion layer between the base and the collector is controlled to be small to have a large electric field in this region, facilitating the acceleration of carriers. That is to say, the reduction of the base-collector breakdown voltage to some extent facilitates impact ionization and enables the memory operation at a lower voltage (that is, the collector-emitter voltage $V_{CE}$: 4.9 (V) in this example). This is very favorable in view of matching with the 5 V power source that has been conventionally used.

In addition, the semiconductor memory device in accordance with this embodiment may readily provide a large capacity static RAM or the like, because it has a memory cell including a P-channel MOS transistor PM for selecting and a bipolar transistor BN for memorizing as described above.

Figure 8:
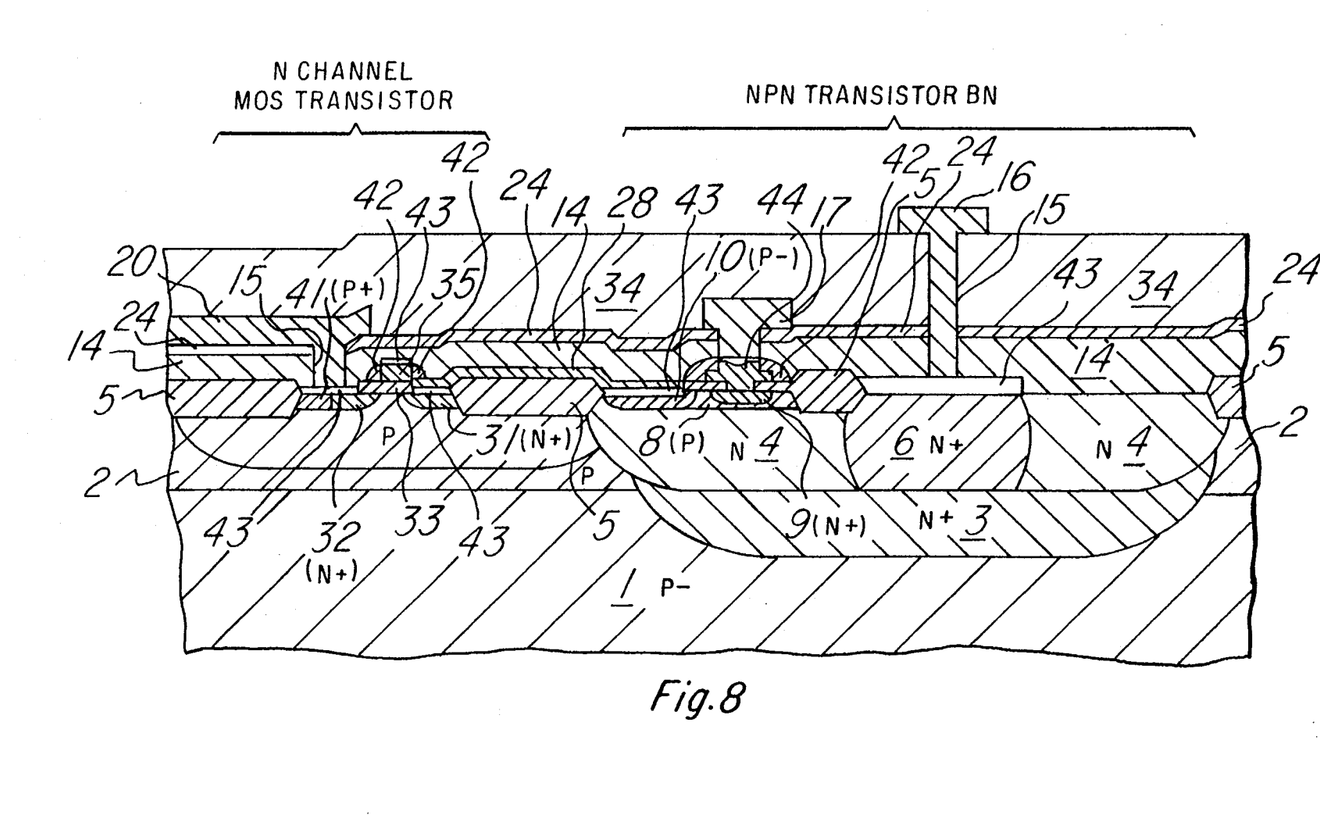
FIG. 8 is a cross-sectional view of a memory cell showing an example using an N-channel MOS transistor as the transistor for selecting (a cross-sectional view taken alone the line VIII—VIII in FIG. 9 below)
Figure 9:
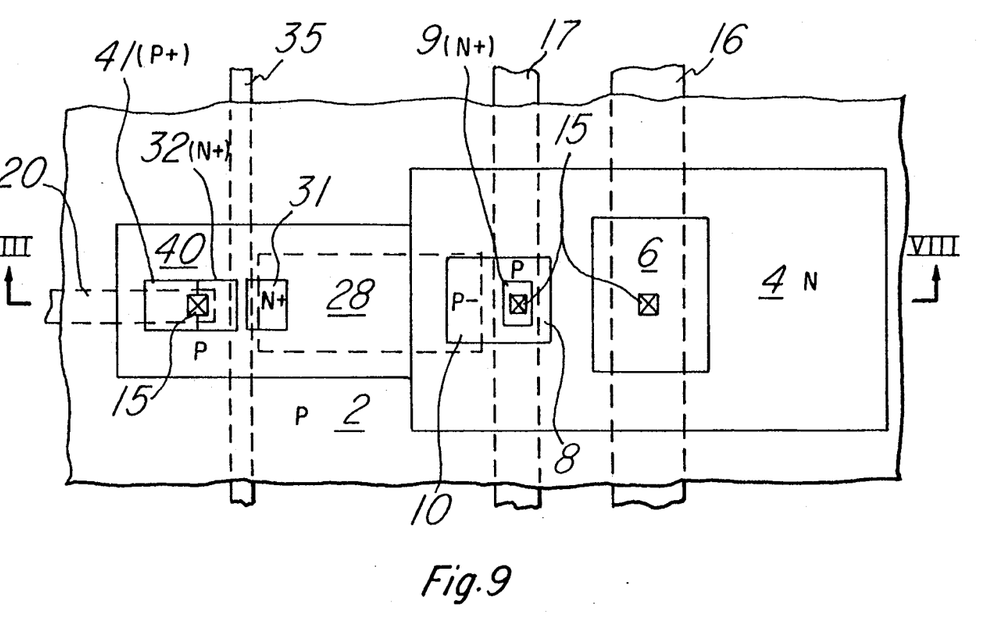
FIG. 9 is a plane view of FIG. 8.

FIGS. 8 and 9 show an example when an N-channel MOS transistor is used as a transistor for selecting for the memory cell in place of the P-channel MOS transistor PM in the above described example. However, for the parts similar to those of the above described example, their explanations may be omitted by putting the same numerals for the sake of convenience in description.

Referring mainly to the different points from the above described example, as shown in FIG. 8, a polysilicon layer 44 is formed on an N+-type collector region 9 in the NPN transistor BN for memorizing and, moreover, an aluminum distribution layer 17 is formed as a collector electrode via a TiSi₂ layer 43 which is provided on said polysilicon layer 44. In addition, a titanium silicide layer 48 is, as shown in the drawing, formed on the diffusion region each of the numerals 10, 31, 32 and 41. With an N+-type diffusion region 6, formed in an N-well 4, as an emitter electrode take-out region, a titanium silicide layer 43 is formed on said N+-type diffusion region 6 and, moreover, an aluminum distribution layer 16 provided via a contact hole 15 is formed as an emitter electrode.

On the other hand, an N+-type drain region 31 and an N+-type source region 32 are formed in a predetermined pattern in a P-type diffusion region (P-type well) 40 provided in a P-type epitaxial layer 2, and a rate electrode 35 is provided between these regions via a rate oxide film 33, thus leading to the construction of an N-channel MOS transistor (transistor for selecting) NM1.

Figure 10:
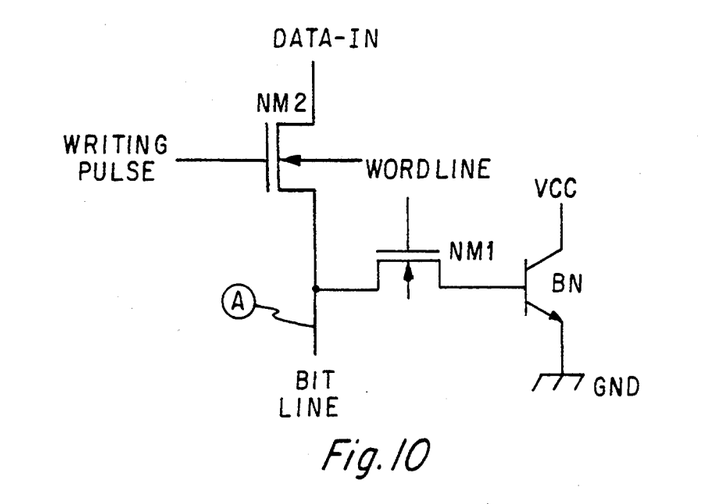
FIG. 10 is an equivalent circuitry diagram of the memory cell in FIGS. 8 and 9.

Then, a base electrode take-out region 10 of the NPN transistor BN and a drain region 31 of the N-channel transistor NM1 are, as shown in FIG. 8, connected by a titanium nitride layer 28 formed on the N+-type drain region 31 and the P+-type base electrode take-out region 10 and further on a field oxide film 5 located between the above two regions, thus leading to the construction of a memory cell as shown by an equivalent circuitry diagram in FIG. 10. In the drawing, the numerals 24 and 34 are insulating layers, 41 is a P+-type diffusion region for prevention of latch-up, 42 is a side wall silicon oxide film, and FIG. 9 is a plane view of FIG. 8 (FIG. 8 is a cross-sectional view taken along the line VIII—VIII in FIG. 9).

As described above, the construction of a memory cell with use of the N-channel MOS transistor NM1 as a transistor for selecting makes it unnecessary, as shown in FIG. 9, to provide an isolation region between a region in which the NPN-transistor BN for memorizing is formed and a region in which the N-channel MOS transistor NM1 for selecting is formed (that is, using the P-type well 40 formed in the P-type epitaxial layer 2, the N-channel MOS transistor NM1 for selecting may be formed in a region adjacent to the NPN transistor BN by providing the N+-type source 32 and the drain 31 inside said P-type well), thus resulting in a great convenience in terms of layout.

Figure 11:
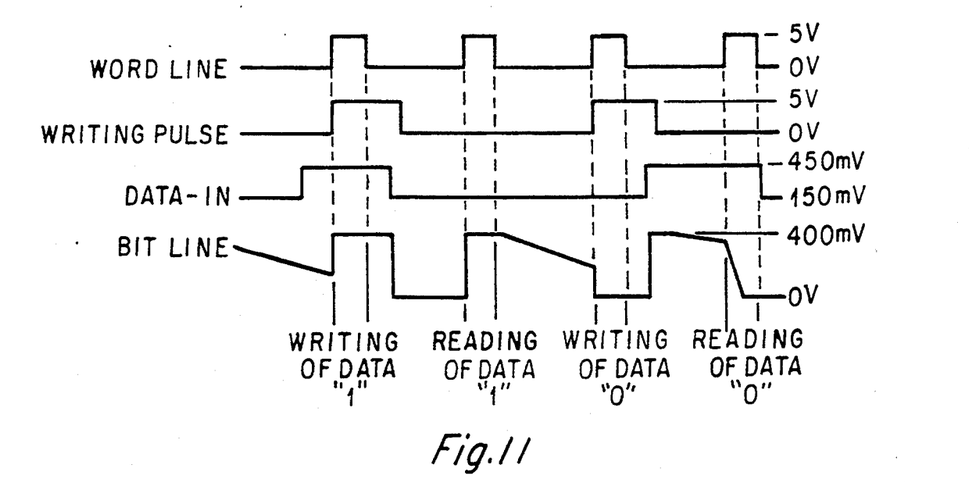
FIG. 11 is a timing chart showing the operation of the memory cell at the time of writing and reading in FIG. 10.

FIGS. 10 and 11, respectively, are an equivalent circuitry diagram and a timing chart to confirm the data writing and reading operation in the memory cell in accordance with the above-mentioned example. However, since using any of a P-channel MOS transistor and an N-channel MOS transistor as a transistor for selecting results in the same memory operation in the memory cell, a description here is made about an example using an N-channel MOS transistor as the transistor for selecting.

An N-channel MOS transistor NM2 in FIG. 10 is to control the writing operation, and the memory operation as shown below is determined by a combination of the N-channel MOB transistors NM2 and NM1. Furthermore, the point "A" turns into a floating state when both the N-channel MOS transistors NM1 and NM2 are turned off.

| NM1 | ON | ON |
|---|---|---|
| NM2 | ON | OFF |
| Operation | Writing | Reading |

In addition, the region each for writing and reading of

In addition, the region each for writing and reading of the data "1" and writing and reading of the data "0" in the timing chart shown in FIG. 11 will be described below.

[Region for Writing of "1"]

Both the N-channel MOS transistors NM1 and NM2 are in the state of ON, with entry of "1" made as data. At this time the base of the NPN transistor BN is forward-biased to induce impact ionization and then turns into a memory state.

[Region for Reading of "1"]

This is in the state that the N-channel MOS transistor NM1 is ON and the N-channel MOS transistor NM2 is OFF. Since at this time the point "A" (bit line) is cut off from the signal of data and connected with the base of the NPN transistor BN, it follows that the base potential appears directly at the point "A". That is, here appears "1" which has been memorized in advance.

[Region for Writing of "0"]

After the data input is set at "0" in advance, the N-channel MOS transistors NM1 and NM2 are turned on. When the bit line is observed at this time, "1" has been maintained all the time at the point "A", which has been a floating node, but the potential rapidly declines to a level of "0". At this time the data is written in the NPN transistor BN.

[Region for Reading of "0"]

This region is in the state that the N-channel MOS transistor NM1 is ON and the N-channel MOS transistor NM2 is OFF, and the data input is again cut off from the point "A". At this time the timing of data input is determined in advance at the point "A" in consideration of the foregoing thing. In the operation at the time of reading out the point "A" is a floating node immediately before reading, and a floating capacity parasitic to each electrode is charged at "1". The NPN transistor BN then comes to pull out this stored charge when "0" level is read from the base.

It will be evident that various modifications may be made to the above described embodiments without departing from the scope of this invention.

In the above described embodiment, for example, an NPN-type transistor has been used as a bipolar transistor for memorizing, but a PNP-type transistor may be used instead. In this case as well it is preferable to have a base region whose base concentration is lower than the ordinary base concentration, but this invention is also applicable to a device which has a base region whose base concentration is, on the contrary, higher than the ordinary base concentration. The expression "the base concentration is higher than the ordinary base concentration" as referred to above means that the base concentration in this case is, for example, preferably $10^{18}$cm$^{-3}$ or more and $10^{23}$cm$^{-3}$ or less, more preferably $10^{19}$cm$^{-3}$ or more and $10^{22}$cm$^{-3}$ or less.

In the above described embodiment, in addition, a vertical bipolar transistor has been used, but a lateral bipolar transistor may be use and the device structure may be modified in various ways.

Furthermore, as the transistor for selecting a bipolar transistor or other appropriate ones may be adopted not limiting to a P-channel MOS transistor or an N-channel MOS transistor.

Since the device in accordance with this invention, as described above, has a memory cell using a bipolar transistor for memorizing, the base concentration of which is either lower or higher than an ordinary base concentration and which is constructed so as to generate a reverse base current, it may perform the memory operation at a low base-emitter voltage $V_{BE}$ ranging, for example, from 0.3 to 0.48 V and thus substantially reduce the consumption of current at the memory cell. In addition, since the above-mentioned memory cell comprises a transistor for selecting and said bipolar transistor for memorizing, this invention may provide a low power consumption yet large capacity semi-conductor memory device.

What is claimed is:

1. A semiconductor memory cell for a static random access memory comprising:

semiconductor substrate means of a first conductivity type;

a bipolar transistor provided in said semiconductor substrate means, said bipolar transistor having emitter, base and collector regions defined in said semiconductor substrate means of the first conductivity type;

said base region of said bipolar transistor being of said first conductivity type, and said emitter and collector regions being of a second conductivity type;

said base region being constructed to enable a reverse base current to be generated therein and having a dopant concentration of said first conductivity type;

said bipolar transistor being disposable in bistable logic states for performing a memory function when the base current becomes "0" via a positive-negative inversion of the base current created by the enablement of the reverse base current generation by producing an output at a high level corresponding to a logic "1" state when a base-emitter voltage exists at a high level above a threshold level and by producing an output at a low level corresponding to a logic "0" state when the base-emitter voltage is below the threshold level, the memory function as performed by said bipolar transistor being conditioned upon the magnitude of the base-emitter voltage being in the range of 0.2 to 0.5 volts; and a transistor electrically connected to said bipolar transistor and actuatable to select said bipolar transistor for a write/read operation to store a particular logic state in said bipolar transistor by the magnitude of the base-emitter voltage thereof in a write operation and to provide an output of the logic state stored in said bipolar transistor in a read operation.

2. A semiconductor memory cell as set forth in claim 1, further including a buried semiconductor layer of the second conductivity type disposed in said semiconductor substrate means of the first conductivity type and located beneath said bipolar transistor.

3. A semiconductor memory cell as set forth in claim 2, further including a well region of the second conductivity type formed in said semiconductor substrate means of the first conductivity type and disposed on said buried layer of the second conductivity type, said buried layer of the second conductivity type having a higher dopant concentration than said well region of the second conductivity type;

said base region of said first conductivity type being disposed in said well region of the second conductivity type, and said collector region of the second conductivity type being provided in said base region of said first conductivity type; and said emitter region of the second conductivity type being provided in said well region of the second conductivity type and having a higher dopant concentration than said well region.

4. A semiconductor memory cell as set forth in claim 1, wherein said semiconductor substrate means of the first conductivity type comprises a semiconductor body of the first conductivity type and an epitaxial semiconductor layer disposed on said semiconductor body, said epitaxial semiconductor layer being of said first conductivity type and having a higher dopant concentration than said semiconductor body.

5. A semiconductor memory cell as set forth in claim 1, wherein said bipolar transistor is an NPN transistor.

6. A semiconductor memory cell as set forth in claim 5, wherein said base region is of P-type conductivity having a boron dopant concentration in the range of $10^{14} cm^{-3}$ to $10^{17} cm^{-3}$.

7. A semiconductor memory cell as set forth in claim 6, wherein said collector region is of N-type conductivity having an arsenic dopant concentration in the range of $10^{18} cm^{-3}$ to $10^{22} cm^{-3}$; and said emitter region is of N-type conductivity having a phosphorus dopant concentration in the range of $2 \times 10^{13} cm^{-3}$ to $10^{17} cm^{-3}$.

8. A semiconductor memory cell as set forth in claim 5, wherein said base region is of P-type conductivity having a boron dopant concentration in the range of $10^{15} cm^{-3}$ to $2 \times 10^{16} cm^{-3}$.

9. A semiconductor memory cell as set forth in claim 8, wherein said collector region is of N-type conductivity having an arsenic dopant concentration in the range of $10^{19} cm^{-3}$ to $5 \times 10^{21} cm^{-3}$; and said emitter region is of N-type conductivity having a phosphorus dopant concentration in the range of $10^{14} cm^{-3}$ to $10^{16} cm^{-3}$.

10. A semiconductor memory cell as set forth in claim 1, wherein the memory function as performed by said bipolar transistor is provided when the magnitude of the base-emitter voltage is in the range of 0.3 to 0.48 volts.

11. A semiconductor memory cell as set forth in claim 1, wherein said transistor electrically connected to said bipolar transistor comprises a field effect transistor provided in said semiconductor substrate means of the first conductivity type adjacent to said bipolar transistor, said field effect transistor having spaced source and drain regions of the same conductivity type; and a conductive layer connecting the drain region of said field effect transistor to the base region of said bipolar transistor.

12. A semiconductor memory cell as set forth in claim 11, wherein said field effect transistor is a P-channel MOS transistor.

13. A semiconductor memory cell as set forth in claim 11, wherein said field effect transistor is an N-channel MOS transistor.

* * * * *